United States Patent [19]

Seki

[11] 3,843,935

[45] Oct. 22, 1974

[54] DIFFERENTIAL AMPLIFIER

[75] Inventor: Kunio Seki, Tokyo, Japan

[73] Assignee: Hitachi, Ltd., Tokyo, Japan

[22] Filed: Mar. 21, 1973

[21] Appl. No.: 343,288

[30] Foreign Application Priority Data

Mar. 21, 1972 Japan ................................ 47-27396

[52] U.S. Cl. .................... 330/30 D, 330/24, 330/69

[51] Int. Cl. ............................................ H03f 3/68

[58] Field of Search ....................... 330/30 D, 24, 40

[56] References Cited

UNITED STATES PATENTS 3,569,849 3/1971 Cassidy et al. ........................ 330/24

3,622,897 11/1971 Tsugita ............................ 330/40 X 3,694,761 9/1972 Golembeski .................. 330/30 DX

OTHER PUBLICATIONS

Philips Application Note, "Humdepression in Noises," Fed. Andro. Application of the TAA300, pp. 1–4, by Donkers.

*Primary Examiner*—Nathan Kaufman

*Attorney, Agent, or Firm*—Craig & Antonelli

[57] ABSTRACT

A differential amplifier wherein means to attenuate the AC component of a DC supply voltage is provided, to reduce hum noises, lower the distortion factor and prevent crosstalk in an amplifier circuit which is connected at a stage succeeding the differential amplifier.

5 Claims, 5 Drawing Figures

DIFFERENTIAL AMPLIFIER

BACKGROUND OF THE INVENTION

1. Field of the Invention

The present invention relates to differential amplifiers and, more particularly, to a differential amplifier which is provided with means, such as a ripple filter, for attenuating the AC component of a supply voltage.

2. Description of the Prior Art

The differential amplifier is indispensable for a low-frequency amplifier device and so forth, and is employed in a variety of appliances and equipments.

In the most fundamental differential amplifier, two transistors are provided, the emitter electrodes of which are connected to a constant-current source. The general differential amplifier of such construction has the property that the influences of offset and a drift voltage do not appear in the differential output. On the other hand, with resepct to fluctuations in the supply voltage (power source ripples), it has been considered that the variations cancel each other and that they do not appear in the differential output. In particular, for an output derived from the respective collector electrodes of a pair of transistors constituting a differential output amplifier as is disclosed in, for example, the specification of U.S. Pat. No. 3,277,385, fluctuations in the power supply were deemed to cause substantially no problem.

On the other hand, hum and distortion sometimes cause problems in an acoustic amplifier circuit, etc., employing a differential amplifier. Countermeasures against power source ripple for amplifiers other than the differential amplifier as comprised in an acoustic amplifier circuit, etc., were, therefore, effected on the basis of the common opinion that the differential amplifier is hardly susceptible to the influence of the power supply ripple. It was impossible, however, to eliminate the hum and distortion, as desired and the cause was not clear, either.

Then, the effect of power source ripple in the differential amplifier was investigated, and it was suspected that the causes for the hum and distortion were also involved in the differential amplifier. As the result of the study of the causes, the following facts have been revealed.

Since the impedances of both input portions of the differential amplifier are changed by means of, for example, a variable resistor for volume control, they are not always equal. This leads to the problem that the variations of the supply voltage appear in the differential output.

More significantly, it has been found out by the inventor in this application that, in the case of taking out the differential output by utilizing a level shift transistor $T_{24}$ as is illustrated in FIGS. 1*a* and 1*b*, there are disadvantages as stated below.

In the case of FIG. 1*a*, the AC component of a supply voltage $V_{CC}$ appears at an output terminal O through a resistor $R_{21}$ and the output impedance 1/hoe (hoe: output admittance with open input) of the transistor $T_{24}$. In the case of FIG. 1*b*, the AC component of the supply voltage $V_{CC}$ appears at the output terminal O directly through the output impedance 1/hoe of the transistor $T_{24}$. The unnecessary AC signal thus appearing at the output terminal O is amplified by an amplifier circuit at the next stage. It is, therefore, more serious as the gain of the amplifier circuit at the next stage becomes higher.

The variation, or AC component $\Delta V_{CC}$, of the supply voltage $V_{CC}$ arises in the following cases, and brings forth phenomena as discussed below when the circuits in FIGS. 1*a* and 1*b* are used.

1. A case where the DC power source $V_{CC}$ is obtained by rectifying and smoothing a branched supply voltage. In this case, the AC component becomes the cause for the hum.

2. A case where a B-class or AB-class amplifier or the like is connected at the subsequent stage of the differential amplifier. Even where a DC power supply employing a cell, battery or the like is used as the power source $V_{CC}$, the DC supply voltage $V_{CC}$ fluctuates by changes of a supply current as attributable to the internal impedance thereof and the B-class or AB-class amplification operation. The variation is fed-back through the differential amplifier to the B-class or AB-class amplifier, and it becomes the cause for distortion of the amplified signal. Further, it becomes the cause for crosstalk in a stereo amplifier, etc.

SUMMARY OF THE INVENTION

It is, accordingly, an object of the present invention to provide a differential amplifier which is compensated for fluctuations in a power source thereof.

Another object of the present invention is to provide a differential amplifier which is provided with means, such as a ripple filter, for attenuating the AC component of a supply voltage.

The present invention itself and the features and advantages thereof will become apparent from the following description taken with reference to the accompanying drawings.

PREFERRED EMBODIMENTS OF THE INVENTION

Figure 1A:
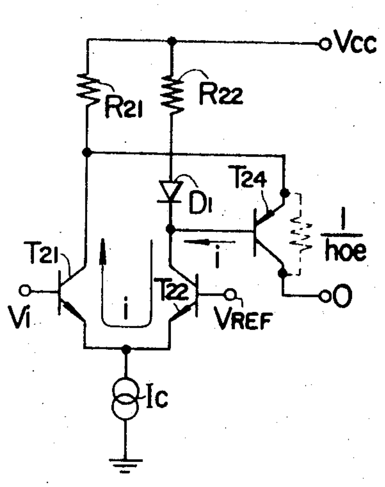
FIGS. 1*a* and 1*b* are circuit diagrams each showing the prior-art differential amplifier which has already been discussed.
Figure 1B:
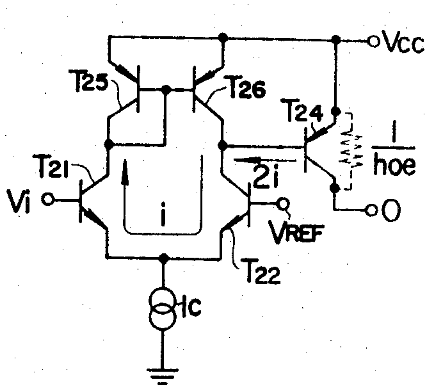
Figure 2:
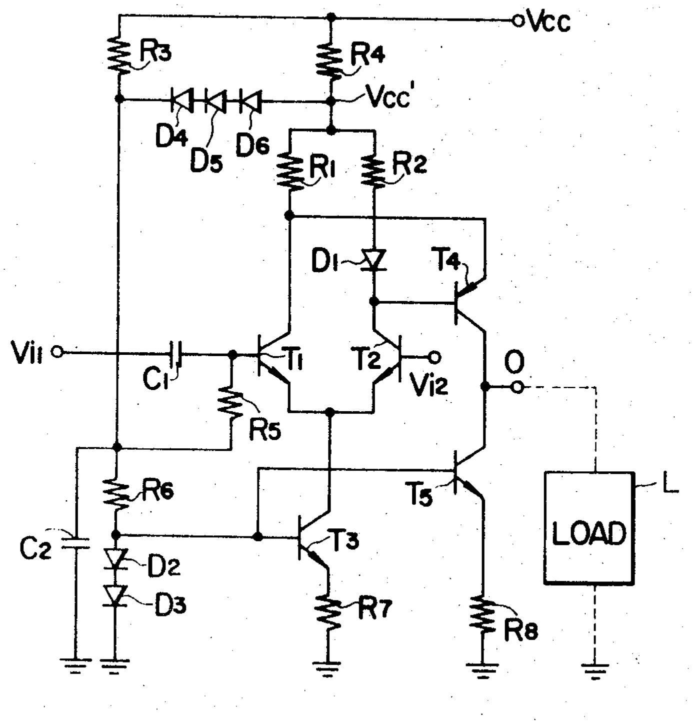
FIGS. 2 to 4 are circuit diagrams each showing an embodiment of a differential amplifier according to the present invention.

FIG. 2 shows an embodiment of a differential amplifier according to the present invention.

Referring to the figure, the emitter electrodes of transistors $T_1$ and $T_2$ are both connected to a constant-current source which is constituted of resistors $R_3$, $R_6$, diodes $D_2$, $D_3$, a transistor $T_3$ and a resistor $R_7$. The collector electrode of the transistor $T_1$ is connected to a collector load resistor $R_1$, while the collector electrode of the transistor $T_2$ is connected through a diode $D_1$ to a collector load resistor $R_2$. The base electrode of the transistor $T_1$ has an input signal $V_{i1}$ applied thereto through a coupling capacitor $C_1$. The base electrode of the transistor $T_2$ has an input signal $V_{i2}$ applied thereto. Although a bias voltage obtained by dividing a supply voltage $V_{CC}$ by the resistors $R_3$ and $R_6$ is impressed on the base electrode of the transistor $T_1$, the AC component $\Delta V_{CC}$ of the supply voltage $V_{CC}$ is bypassed by a capacitor $C_2$ and is not applied to the base electrode of the transistor $T_1$. The emitter and base electrode of a level shift transistor $T_4$ are connected to the collector electrodes of the transistors $T_1$ and $T_2$, respectively, to thereby take out a differential output. More specifically, differential branch currents flowing through the transistors $T_1$ and $T_2$ flow into the base electrode of the transistor $T_4$. A transistor $T_5$ and a resistor $R_8$ constitute a part of the constant-current circuit, and cause a bias current to flow through the transistor $T_4$.

The collector load resistors $R_1$ and $R_2$ are connected through a resistor $R_4$ to the DC power source $V_{CC}$.

It has been considered, in the circuit of FIG. 2, to incorporate a Zener diode between the junction of the resistors $R_1$, $R_2$ and $R_4$ and ground. The incorporation, however, is disadvantageous in that, if a Zener diode is formed in an integrated semiconductor circuit along with the differential circuit, the condition of the circuit is restricted since it is difficult in the manufacturing technique of integrated semiconductor circuits to bring the breakdown voltage of the Zener diode to a prescribed value. Even if a simple body of a Zener diode is employed, the condition of the circuit is similarly restricted since the different available types of Zener diodes is limited.

In order to attenuate fluctuations in the power source $V_{CC}$, the differential amplifier in FIG. 2 employs three diodes $D_4$ – $D_6$ and capacitor $C_2$. In this case, a variation $\Delta V_{CC}'$ of the voltage source $V_{CC}'$ of the differential circuit is attenuated to the following value, if the impedance of the capacitor $C_2$ is neglected:

$$\Delta V_{CC}' = n \cdot r_d/R_4 \, \Delta V_{CC}$$

where $r_d$ is the differentiating or operating resistance of each diode, $n$ is the number of diodes connected between the power source $V_{CC}'$ and the resistor $R_6$ ($n = 3$ in the illustrated embodiment), and $$R_4 >> n \cdot r_d.$$

The voltage level of the voltage source $V_{CC}'$ can be set at a predetermined value by appropriately selecting the number $n$ of the diodes.

Figure 3:
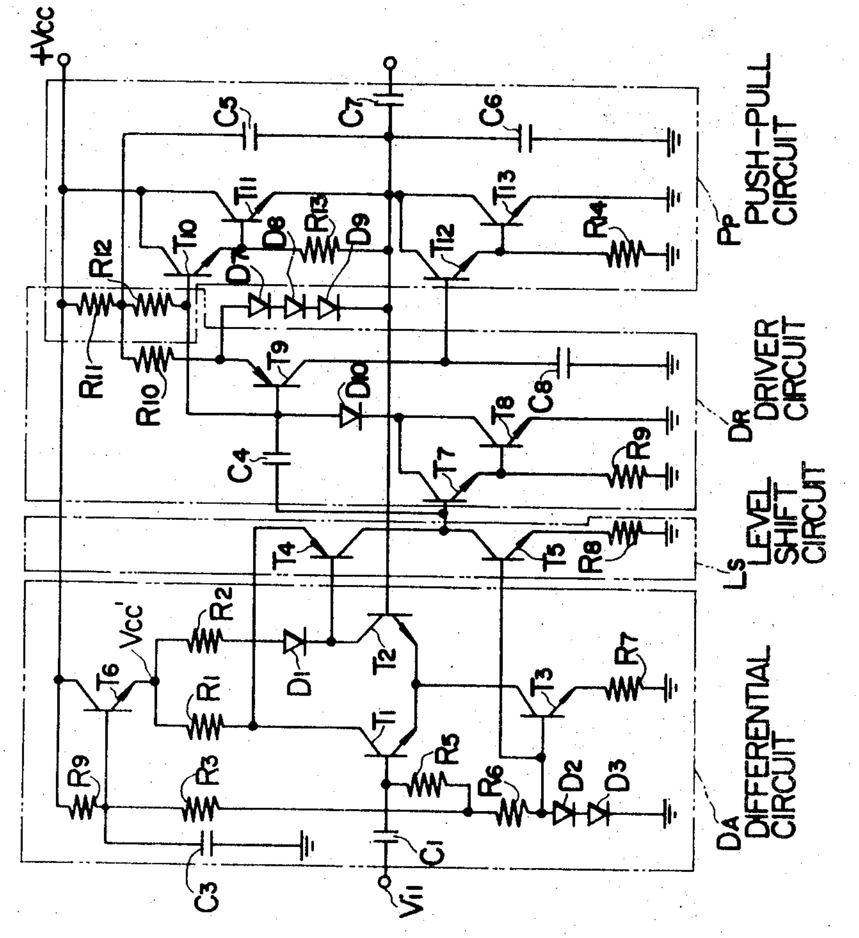

FIG. 3 illustrates another embodiment in which the differential amplifier according to the present invention is applied to a power amplifier circuit. In the figure, the same parts as in FIG. 2 are indicated by the same symbols.

Referring to FIG. 3, DA designates a differential circuit, and LS a level shift circuit for level-shifting the output potential of the differential circuit. DR indicates a driver circuit which effects class-A amplification operation, and which is connected to the level shift circuit LS. Shown at PP is a push-pull circuit, which is driven by the driver circuit DR.

As means to attenuate the AC component of the supply voltage of the differential circuit DA in such a power amplifier circuit, a ripple filter is utilized which consists of a transistor $T_6$, a resistor $R_9$ and a capacitor $C_3$. The transistor $T_6$ has the resistor $R_9$ connected between the base and collector thereof, has the base electrode grounded through the capacitor $C_3$, and has the supply voltage $V_{CC}$ applied to the collector electrode.

With such a construction, the variation $\Delta V_{CC}'$ of the voltage source $V_{CC}'$ applied to the differential circuit is expressed relative to the variation $\Delta V_{CC}$ of the supply voltage $V_{CC}$ by the following equation:

$$\Delta V_{CC}' \approx 1/ \quad 1 + (2\pi f C_3 R_9)^2 \, \Delta V_{CC} \approx 1/2\pi f C_3 R_9 \, \Delta V_{CC}$$

where $f$ is the fluctuating frequency of the power source $V_{CC}$, and $2\pi f C_3 R_9 >> 1$.

It will be, accordingly, understood that, if the resistance of the resistor $R_9$ and the capacitance of the capacitor $C_3$ are made large, the ripple component $\Delta V_{CC}$ are largely attenuated. At, for example, $C_3 = 100\mu F$, $R_9 = 30K\Omega$ and $f = 50$ Hz, the variation $\Delta V_{CC}'$ is attenuated by about 60 dB relative to the variation $\Delta V_{CC}$.

Although the DC level of the voltage $V_{CC}'$ becomes low by making the resistance of the resistor $R_9$ large, this does not raise a serious problem with regard to the driver circuit DR, the differential amplifier DA, etc. Since the voltage $V_{CC}$ is used as the power source of the driver circuit DR, the resistance of the resistor $R_9$ can be made large without lowering the output potential thereof (without lowering the voltage utilization factor of the power source $V_{CC}$). Accordingly, the driver circuit DR can satisfactorily drive the push-pull circuit PP which is the load thereof.

As the emitter — collector voltage $V_{CE}$ of the paired transistors $T_1$ and $T_2$ constituting the differential amplifier, at most 1 V or so suffices. Therefore, even if the DC level of the voltage $V_{CC}'$ decreases, no serious problem occurs.

The resistance of the resistor $R_9$ can, consequently, be made large without any restriction from the driver circuit DR, the differential circuit DA, etc., so that the variation $\Delta V_{CC}$ is sufficiently attenuated by the ripple filter. This removes the necessity for providing another ripple filter specifically for the bias circuit of one transistor $T_1$ of the differential amplifier DA. To provide an additional ripple filter anew leads to the necessity for an additional capacitor. From this viewpoint, the present embodiment can reduce the number of components.

In the case of making the differential circuit DA, etc., in the form of integrated semiconductor circuits, since a capacitor of large capacitance cannot be formed of an integrated semiconductor circuit under the present state of the art, it can be said in view thereof that, according to the present embodiment, the number of external terminals of the integrated semiconductor circuits can be reduced, while the entire circuit can be miniaturized.

Figure 4:
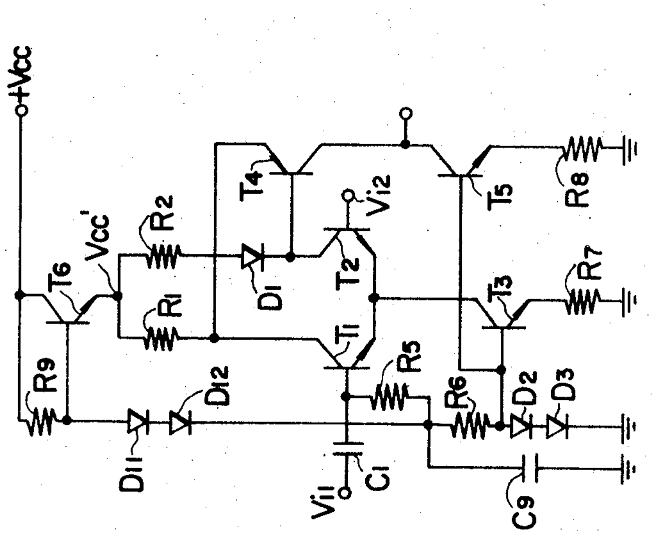

FIG. 4 shows still another embodiment of the differential amplifier according to the present invention. In the figure, the same parts as in FIG. 3 are indicated by the same symbols.

Referring to FIG. 4, a ripple filter composed of the transistor $T_6$, diodes $D_{11}$ and $D_{12}$, resistor $R_9$ and capacitor $C_9$ is employed as the means for attenuating the variation of the power source $V_{CC}$.

According to such construction, fluctuations in the bias voltage of the transistor $T_1$ are made substantially negligible by the capacitor $C_9$. Fluctuations in the voltage $V_{CC}'$ are attenuated as in the embodiment in FIG. 3, if the operating resistances of the diodes $D_{11}$ and $D_{12}$ are neglected.

The diodes $D_{11}$ and $D_{12}$ are used in order to adjust the DC level of the voltage $V_{CC}'$. Since the DC level of the voltage $V_{CC}'$ is compensated for by the diodes $D_{11}$ and $D_{12}$, the resistor $R_9$ can, accordingly, be made large to raise the attenuation factor of ripples. Although the illustrated embodiment employs the two diodes $D_{11}$ and $D_{12}$, the number is not restrictive.

As described above, in accordance with the present invention, the voltage source $V_{CC}'$ having an AC component such as hum is attenuated by a ripple filter or like means, used as the power source of the differential amplifier. Therefore, an AC component leaking through the level shift transistor $T_4$ is attenuated to the extent that no inconvenience occurs in practical use. The problems previously stated are, accordingly, solved.

That is, where the general amplifier is connected at the stage succeeding the differential amplifier according to the present invention, hum noise can be made small. Where a class-B or class-AB amplifier is similarly connected, the distortion factor can be made small. Further, in a stereo amplifier, crosstalk can be prevented, i.e., when one of the channels has no signal and a voice signal is contained only in the other channel, the voice signal leaks through a power source section to the former channel.

What is claimed is:

1. In a differential amplifier circuit having:

first and second transistors, each having a base, an emitter, and a collector;

first and second input terminals connected to couple first and second input signals to the bases of said first and second transistors, respectively;

a first constant current source connected to the emitters of each of said transistors;

a power supply terminal to which a supply voltage for said amplifier is applied;

output means, connected to the collectors of said first and second transistors for providing an output signal representative of the amplified difference of said first and second signals applied to said first and second input terminals; and means for coupling the supply voltage applied to said power supply terminal to said first and second transistors;

the improvement comprising:

means, connected to said coupling means, for attenuating an alternating current component of the supply voltage applied to said power supply terminal, and substantially preventing said alternating current component of said supply voltage from being supplied to said first and second transistors, comprising a third transistor having a base, an emitter and a collector, the collector of which is connected to said power supply terminal and the emitter of which is resistively coupled to the collectors of said first and second transistors, with a resistor being connected between the collector and base of said third transistor and a capacitor being connected between the base of said third transistor and a reference potential terminal.

2. A differential amplifier circuit according to claim 1, wherein the product of the resistance value R of said resistor and the capacitance value of C of said capacitor satisfied the relationship $RC >> 1/2\pi f$, where $f$ is the fluctuating frequency of the voltage applied to said power supply terminal.

3. In a differential amplifier circuit having:

first and second transistors, each having a base, an emitter, and a collector;

first and second input terminals connected to couple first and second input signals to the bases of said first and second transistors, respectively;

a first constant current source connected to the emitters of each of said transistors;

a power supply terminal to which a supply voltage for said amplifier is applied;

output means, connected to the collectors of said first and second transistors for providing an output signal representative of the amplified difference of said first and second signals applied to said first and second input terminals; and means for coupling the supply voltage applied to said power supply terminal to said first and second transistors;

the improvement comprising:

means, connected to said coupling means, for attenuating an alternating current component of the supply voltage applied to said power supply terminal, and substantially preventing said alternating current component of said supply voltage from being supplied to said first and second transistors, comprising a third transistor having a base, an emitter, and a collector, the collector of which is connected to said power supply terminal and the emitter of which is resistively coupled to the collectors of said first and second transistors, with a resistor being connected between the collector and base of said third transistor and further including a diode circuit and a capacitor connected in series between the base of said third transistor and a reference potential terminal.

4. A differential amplifier circuit according to claim 3, wherein the junction of said diode circuit and said capacitor is coupled to the base of one of said first and second transistors.

5. In a differential amplifier circuit having:

first and second transistors, each having a base, an emitter, and a collector;

first and second input terminals connected to couple first and second input signals to the bases of said first and second transistors, respectively;

a first constant current source connected to the emitters of each of said transistors;

a power supply terminal to which a supply voltage for said amplifier is applied;

output means, connected to the collectors of said first and second transistors for providing an output signal representative of the amplified difference of said first and second signals applied to said first and second input terminals; and means for coupling the supply voltage applied to said power supply terminal to said first and second transistors;

the improvement comprising:

ripple filter means including a first resistor connected between the power supply and respective load resistors coupled to the collectors of said first and second transistors of the differential amplifier;

a second resistor one terminal of which is connected to the power supply;

a diode circuit of at least one diode connected between the other terminal of said second resistor and the connection point of said first resistor and the load resistors, so that said diode circuit is forward-biased; and a capacitor connected between the other terminal of said second resistor and a common reference potential.

* * * * *